United States Patent

Ramer et al.

[11] Patent Number: 5,804,823
[45] Date of Patent: Sep. 8, 1998

[54] BISMUTH LAYERED STRUCTURE PYROELECTRIC DETECTORS

[75] Inventors: O. Glenn Ramer, Los Angeles; David A. Robinson, Oceanside; John J. Drab, Encinitas, all of Calif.

[73] Assignee: Raytheon Company, Lexington, Mass.

[21] Appl. No.: 540,533

[22] Filed: Oct. 10, 1995

[51] Int. Cl.⁶ .................................................. G01J 5/12
[52] U.S. Cl. ................................. 250/338.3; 250/338.2
[58] Field of Search .............................. 250/338.3, 338.2

[56] References Cited

U.S. PATENT DOCUMENTS

| | | | |
|---|---|---|---|
| 4,867,850 | 9/1989 | Oka et al. | 250/338.3 X |
| 5,283,438 | 2/1994 | Dautriche | 250/338.3 |
| 5,478,610 | 12/1995 | Desu et al. | 427/573 |

FOREIGN PATENT DOCUMENTS

| | | | |
|---|---|---|---|
| 58-58424 | 4/1983 | Japan | 250/338.3 |
| 58-58441 | 4/1983 | Japan | 250/338.3 |
| 58-52176 | 11/1983 | Japan | 250/338.3 |
| 63-311124 | 12/1988 | Japan | 250/338.3 |
| WO 93/12538 | 6/1993 | WIPO . | |
| WO 93/12542 | 6/1993 | WIPO . | |
| WO 94/10702 | 5/1994 | WIPO . | |

OTHER PUBLICATIONS

"Ferroelectric Crystals" F. Jona et al., Pergamon Press (1962), pp. 274–276.
Non–Metallic Solids, vol. 3, "Piezoelectric Ceramics", W.R. Cook Jr. et al., Academic Press (1971), at pp. 223–227.
"Pyroelectric Detectors and Their Applications", Akram Hossain and Muhammad H. Rashid, IEEE 1991.

Primary Examiner—Edward J. Glick
Attorney, Agent, or Firm—W. C. Schubert; G. H. Lenzen, Jr.

[57] ABSTRACT

This invention teaches a method for fabricating an array (1) of pyroelectric detectors (10), and further teaches an array (1) of pyroelectric detectors (10) that include a bismuth layered compound. The array has a substrate (12) and a plurality of pyroelectric detector sites disposed over a surface of the substrate. Each of the pyroelectric detector sites is constructed to have a first electrode (16); a second electrode (20); and a thin layer (18) containing a bismuth layered compound that is interposed between and electrically coupled to the first and second electrodes. In one embodiment the thin layer is comprised of Y1 material ($SrBi_2Ta_2O_9$), while in another embodiment the layer is comprised instead of YZ material ($SrBi_2Nb_{2-x}Ta_xO_9$).

13 Claims, 5 Drawing Sheets

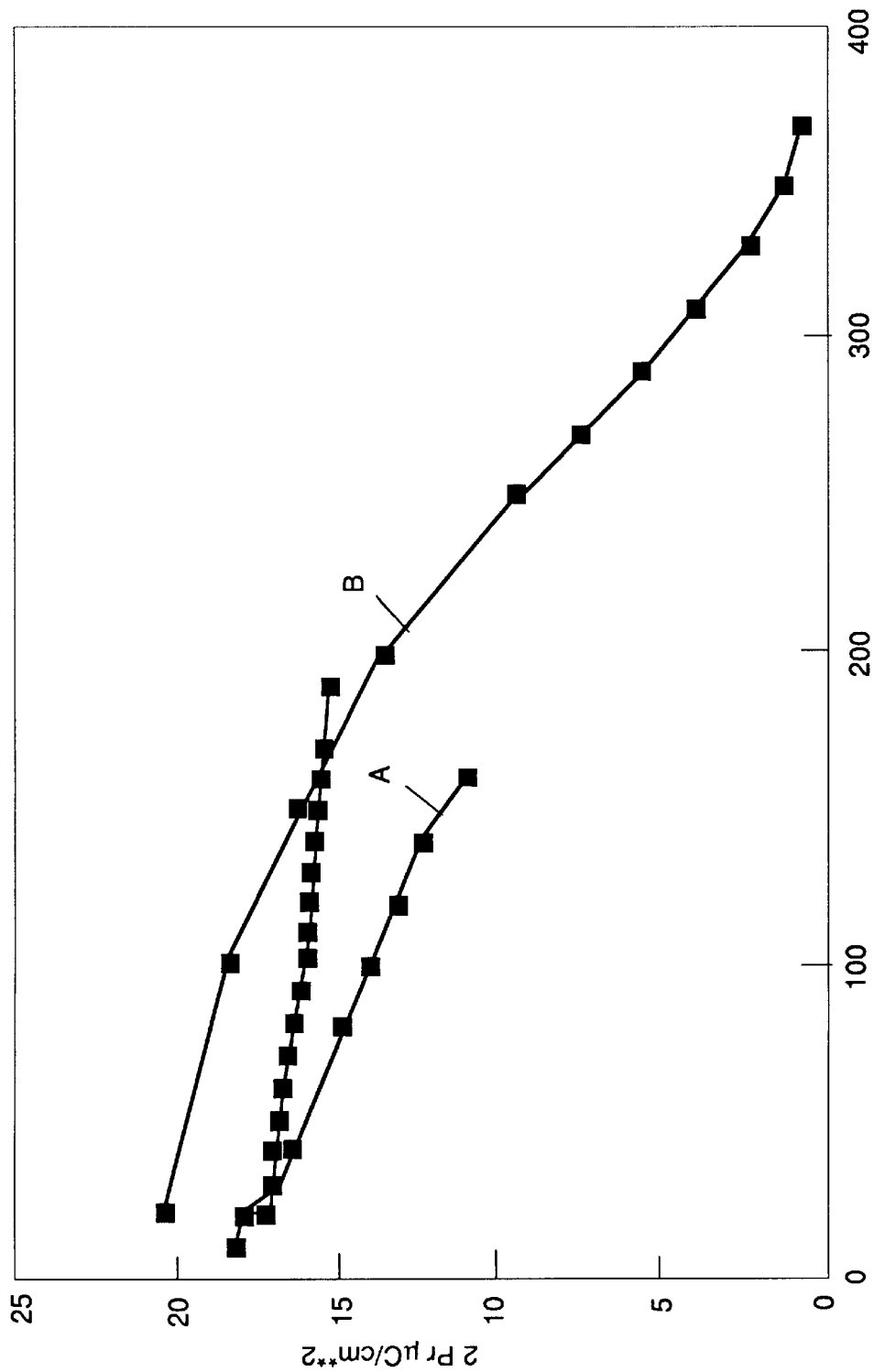

BISMUTH LAYERED STRUCTURE PYROELECTRIC DETECTORS

FIELD OF THE INVENTION

This invention relates generally to thermal detectors and, in particular, to a class of thermal detectors referred to as pyroelectric detectors.

BACKGROUND OF THE INVENTION

A discussion of pyroelectric detectors can be found in an article entitled "Pyroelectric Detectors and Their Applications", IEEE Transactions on Industry Applications, Vol. 27, No. 5, September, October 1991, A. Hossain and M. H. Rashid.

The authors report that the generation of an electric dipole moment in an insulating material, due to a homogeneous change in temperature, is referred to as pyroelectricity. True pyroelectricity can be found only in materials having a unique polar axis. A pyroelectric material generates electric dipole moments which, in turn, generate current. Exemplary pyroelectric materials include lithium tantalate ($LiTaO_3$), triglycine sulphate (TGS), polyvinylidene fluoride ($PVF_2$), barium titantate ($BaTiO_3$), and lead lanthanum zirconate titanate (PLZT).

A pyroelectric detector is said to consist of a thin wafer of dielectric crystal that is suitably poled and oriented. Electrodes are deposited on both faces of the crystal normal to the polar axis. The electrodes may be parallel or perpendicular to the incident radiation being detected. The electrode facing the incident radiation may be blackened, as may a face of the crystal if the electrode is transparent. In operation, the pyroelectric detector acts as a charge-sensing capacitor. When an external circuit is connected across the electrodes (i.e., across the charge-sensing capacitor), accumulated charge will flow through the circuit. The flow of charge is proportional to the rate of change of temperature. If the temperature is unchanging, then there is no current.

Pyroelectric detection represents a significant technology for infrared (thermal) imaging. For example, thin film devices with adequate performance for low cost television quality imaging is a widely-shared goal in the industry. The current state of the art requires detector technology to become more producible, and further requires that individual radiation sensing sites or pixels become smaller while pixel array sizes become larger. In general, it is desirable for the radiation sensing array to evolve in the direction of a monolithic design.

For pyroelectric detectors a change in the output voltage per unit thickness (field) of a pyroelectric material, per unit temperature change, is equal to the ratio of the pyroelectric coefficient of the material to the dielectric permittivity of the material. One disadvantage of the conventional pyroelectric materials is the value of their relative dielectric constant (e.g., >1000 for PLZT). That is, the high dielectric constant acts to reduce the magnitude of the change in the output voltage per unit change in temperature. This disadvantage in turn has placed limitations on the use of pyroelectric materials in fabricating small size radiation responsive pixels, such as those found in high resolution imaging systems.

In WO 93/12542 (pub. 24 Jun. 1993) Paz de Araujo et al. describe a layered superlattice material that is suitable for forming a low fatigue ferrorelectric. Applications of this material are in memory devices, specifically non-volatile and volatile memories. Some specific layered-perovskite materials that are disclosed for use in this application are strontium bismuth tantalate ($SrBi_2Ta_2O_9$), strontium bismuth tantalum niobate ($SrBi_2TaNbO_9$), bismuth titanate ($Bi_4Ti_3O_{12}$), lead bismuth tantalate ($PbBi_2Ta_2O_9$), and barium bismuth niobate ($BaBi_2Nb_2O_9$). Layered superlattice materials are defined by Paz de Araujo et al. as having a localized structure, within a grain or a larger or smaller unit, wherein the localized structure contains predominately repeatable units containing one or more perovskite-like layers and one or more intermediate non-perovskite-like layers that are spontaneously linked in an interdependent manner.

Reference can also be had to WO 93/12542 (pub. 24 Jun. 1993) where Paz de Araujo et al. describe a process for fabricating layered superlattice materials. A precursor liquid (a metal carboxylate in a solvent) is applied to a substrate, and the precursor is then heated to form the layered superlattice material. The process is described as being suitable for use on a semiconductor wafer substrate.

Reference may also be had "Ferroelectric Crystals", F. Jona et al., Pergamon Press (1962), at pages 274–276, wherein $PbBi_2Nb_2O_9$ and related compounds are discussed. The $PbBi_2Nb_2O_9$ compound is said to belong to a large family of multi-layer interstitial compounds. The structural scheme of this material is said to consist of an alternation of a layer of $Bi_2O_2$ with two perovskite-like layers of oxygen octahedra, as is shown in FIG. 5. Reference in this regard can also be made to "Non-Metallic Solids", Vol. 3, "Piezoelectric Ceramics", W. R. Cook Jr. et al., Academic Press (1971), at pages 223–227, for a discussion of bismuth layer structured materials.

OBJECTS OF THE INVENTION

It is a first object of this invention to provide a pyroelectric detector comprised of a bismuth layered material.

It is another object of this invention to provide an array of infrared radiation responsive pyroelectric detector pixels, individual ones of which are comprised of a bismuth layered material.

It is a further object of this invention to provide a method for fabricating an array of pyroelectric detectors.

SUMMARY OF THE INVENTION

The foregoing and other problems are overcome and the objects of the invention are realized by a pyroelectric detector comprised of a thin film of bismuth layered material. The inventors have discovered that this class of ferroelectric material, which was previously unknown for use in pyroelectric detectors and detectors based on sensing changes in the dielectric constant or dielectric loss of a material with temperature, enables the fabrication of thermal detectors and arrays of thermal detectors that overcome the problems inherent in many conventional pyroelectric materials. The bismuth layered materials have a naturally occurring "superlattice" which enables the properties of the material to be varied by a change in the bismuth concentration in the starting material. The material properties can be tailored over a broad range because the ceramic compositions have high solid solubility within each other. These bismuth layered superlattice materials are shown to be suitable for the fabrication of "room temperature" infrared detectors or detector arrays.

One specific advantage of the bismuth layered superlattice material, such as one referred to as "Y1" ($SrBi_2Ta_2O_9$) and one referred to as "YZ" ($SrBi_2Nb_{2-x}Ta_xO_9$), where x is between approximately 0 and approximately 2, is that the dielectric constant is less than other ceramic pyroelectric materials, such as PLZT. This results in an increased output signal and an increase sensitivity. A second advantage of the bismuth layered materials is that it is possible to provide the material as a thin film, without significant degradation in pyroelectric performance as compared to other materials. That is, the layering and break up of long range interaction associated with convention lattices is not experienced in even a very thin film (e.g. $\leq$2000 Å) of bismuth layer material. A third advantage is a flexibility in varying the properties of the material by varying the bismuth concentration in the starting chemistry of the precursor material. A fourth advantage is the ability to tailor the properties by control of the solubility composition, as illustrated by the YZ material. Factors available for variation include, but are not limited to, the metals and compositions of metals in the perovskite layers, and the number of perovskite layers within the bismuth oxide superlattice.

The bismuth layered compound employed by the teaching of this invention may be an Aurivillius material of the form $A_{m-1}^{+2}S_2^{+3}B_m^{+5}O_{3m+3}^{-2}$, where A is Sr, Ca, Ba, Cd, or Pb, or mixtures thereof; m is 2, 4, or 5; S is Bi, Sc, Y, La, Sb, Cr, or Th, or mixtures thereof; and B is Ti, Ta, Nb, Zr, or Hf, or mixtures thereof.

This invention teaches a method for fabricating an array of pyroelectric detectors, and further teaches an array of pyroelectric detectors comprising a bismuth layered compound. The array includes a substrate and a plurality of pyroelectric detector sites disposed over a surface of the substrate. Each of the pyroelectric detector sites is comprised of a first electrode; a second electrode; and a layer comprised of a bismuth layered compound that is interposed between and electrically coupled to the first and second electrodes. In one embodiment the layer is comprised of Y1 material ($SrBi_2Ta_2O_9$), while in another embodiment the layer is comprised instead of YZ material ($SrBi_2Nb_{2-x}Ta_xO_9$), where x is between approximately 0 and approximately 2.

BRIEF DESCRIPTION OF THE DRAWINGS

The above set forth and other features of the invention are made more apparent in the ensuing Detailed Description of the Invention when read in conjunction with the attached Drawings, wherein:

FIG. 2 is graph of polarization vs. temperature for several bismuth layered compounds of interest;

DETAILED DESCRIPTION OF THE INVENTION

This invention employs bismuth layered structures; for example, materials such as those known as Y1 ($SrBi_2Ta_2O_9$) and YZ ($SrBi_2Nb_{2-x}Ta_xO_9$), wherein x is in a range of approximately 0 to approximately 2, in the fabrication of infrared detectors and detector arrays. The resulting pyroelectric detectors are based on sensing changes in the dielectric constant or dielectric loss of the bismuth layer material with temperature.

It should be noted at the outset that the teaching of this invention is not limited for use with only these two particular bismuth layered compounds.

By example, the material 28 can be expanded to include the entire Aurivillius family of materials. An Aurivillius material is of the form $A_{m-1}^{+2}S_2^{+3}B_m^{+5}O_{3m+3}^{-2}$, where A is Sr, Ca, Ba, Cd, or Pb, or mixtures thereof; m is 2, 4, or 5; S is Bi, Sc, Y, La, Sb, Cr, or Th, or mixtures thereof; and B is Ti, Ta, Nb, Zr, or Hf, or mixtures thereof. Such materials were described by B. Aurivillius, *Ark.Kem.*, vol. 1, pages 463–499 (1949). The Aurivillius compounds are known ferroelectric materials having a structure comprised of m perovskite-like units of $ABO_3$ between $Bi_2O_3$-like layers along a pseudo-tetragonal c-axis. The crystal symmetry is pseudo-tetragonal (actually orthorhombic) below the Curie temperature and tetragonal above the Curie temperature. The orthorhombic distortion which occurs as the crystal approaches the phase transition at the Curie temperature is responsible for the positive temperature coefficient of capacitance of the members of this class which is observed below the Curie temperature. See K. C. Subbarao, *J. Phys. Chem. Solids*, vol. 23, pages 665–676 (1962).

As was previously discussed, for pyroelectric detectors the change of the output voltage per unit thickness (field) of the material per unit temperature change is equal to the ratio of the pyroelectric coefficient to the dielectric permittivity. Because of their reduced relative dielectric constant, $\epsilon_r$ of approximately 200 (see FIG. 4) the bismuth layered materials offer improved performance over many conventional pyroelectric materials such as PZT and PLZT, where the relative dielectric constant is greater than 1000. A commonly accepted "figure of merit" for voltage operation of pyroelectric detectors is equal to this output voltage divided by the heat capacity per unit volume.

Figure 1A:
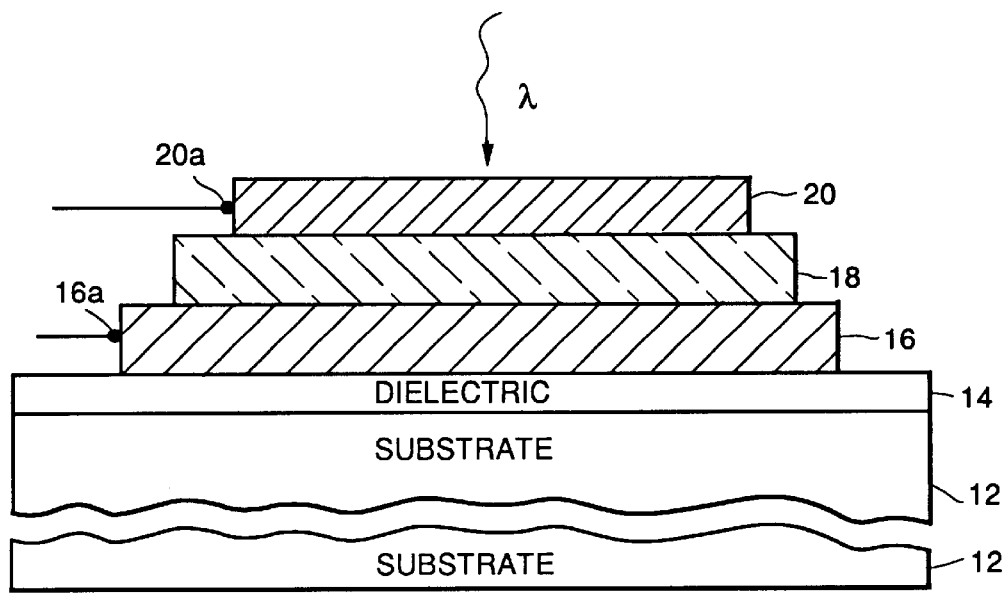
FIG. 1A is an enlarged cross-sectional view, not to scale, that illustrates a pyroelectric detector device in accordance with this invention.

FIG. 1A is an enlarged cross-sectional view, not to scale, of a pyroelectric detector 10 that is constructed in accordance with this invention. A substrate 12, such as a silicon substrate having a nominal thickness of 20 mils, has an insulating dielectric layer 14 formed on a surface thereof. This dielectric layer 14 can be a layer of thermally grown oxide (e.g., $SiO_2$). On the dielectric layer 14 is formed a first electrode 16. The electrode 16 can be comprised of platinum having a thickness in the range of approximately 1000 Å to approximately 2000 Å, and may be sputtered on or applied by electron beam (E-Beam) evaporation. Overlying the first electrode 16, in accordance with this invention, is a layer comprised of a bismuth layered material such as the Y1 or YZ material referred to previously. The layer 18 may have a thickness in the range of approximately 1800 Å to approximately 2400 Å, although both thicker and thinner film layers can be employed. In general, with the bismuth layered structures employed by this invention film thicknesses of 0.2 $\mu$m are typical, and thickness as thin as 0.1 $\mu$m have been demonstrated successfully. Thicker films are of course possible to achieve. In regard to a pyroelectric detector's operation, a reduction in thickness of the bismuth layered material produces a reduction in electrical response. However, the corresponding decrease in the thermal conductance increases the thermal responsivity. Decreased thermal conductance can also be achieved by improved thermal isolation, and/or by a reduction of the total thickness of the pyroelectric detector.

A preferred method to fabricate the layer 18 is to spin-coat on a liquid precursor, and then thermally anneal the precursor to form the layer 18.

Overlying the layer 18 is a second electrode 20 that may also be a platinum electrode that is sputtered or E-Beam evaporated to a thickness in the range of approximately 1000 Å to approximately 2000 Å. The layer 18 is thus interposed between and electrically coupled to the electrode layers 16 and 20. Electrical terminals 16a and 20a are coupled to the electrodes 16 and 20, respectively, for connecting the pyroelectric detector 10, comprised of layers 16, 18 and 20, to an external circuit. One suitable circuit is shown in FIG. 1C, and is similar to that shown in the above referenced article by A. Hossain et al.

Figure 1B:
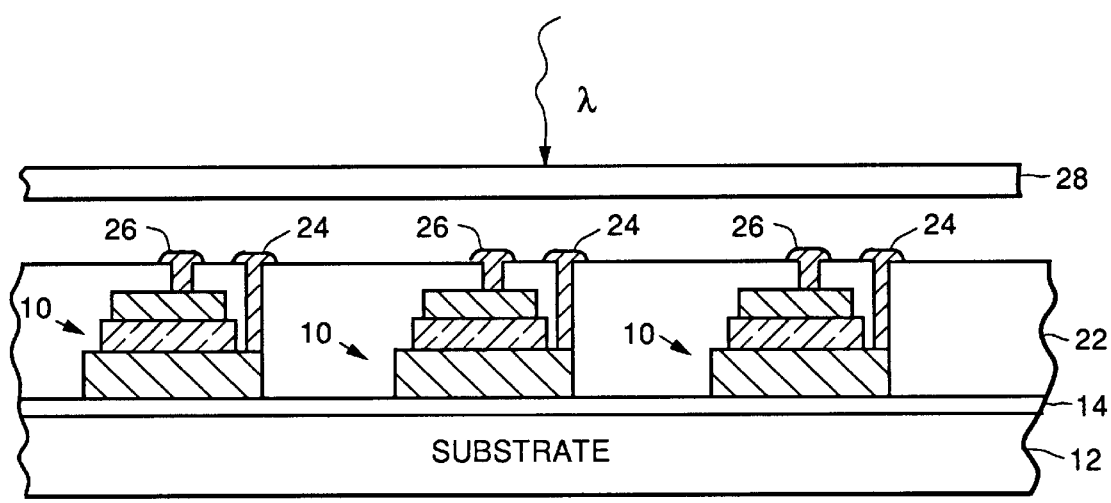
FIG. 1B is an enlarged cross-sectional view, not to scale, that illustrates an array of pyroelectric detector devices in accordance with this invention.
Figure 1C:
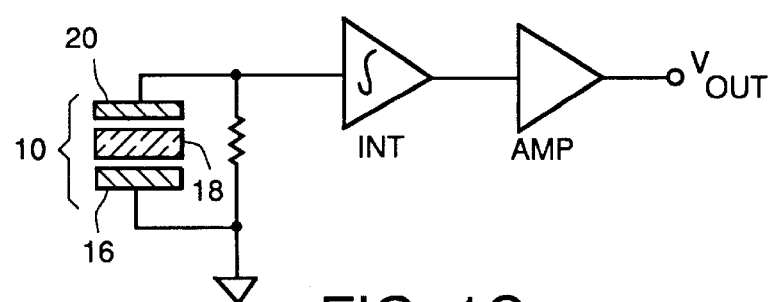
FIG. 1C is a simplified schematic diagram of the pyroelectric detector of FIGS. 1A or 1B and an associated readout circuit.

FIG. 1B illustrates a cross-sectional view, not to scale, of a portion of an array 1 (linear or two-dimensional) of pyroelectric detectors 10 as described above. In this embodiment the detectors 10 are covered with a layer of $SiO_2$ and vias are made for exposing portions of the first and second electrodes. These vias are then filled with a suitable electrical conductor for forming electrical contacts 24 and 26 to the electrodes 16 and 20, respectively. Incident infrared radiation, indicated generally by the arrow designated λ, is absorbed by the layer 22. The resulting heating effect is detected by each of the pyroelectric detectors 10 and the resulting currents are read out through electrical contacts 24 and 26 to external read-out circuits.

One presently preferred method for fabricating the array 1 is to provide the substrate 12 and to grow the layer 14 as a thermal oxide. A platinum layer is then blanket deposited, followed by applying, spinning-on, and annealing the bismuth layered precursor material, such as a solution of metal-organic salts. A suitable anneal temperature has been found to be 725° C., and a suitable anneal time has been found to be four hours. Multiple anneal cycles may be employed. A second layer of platinum is then deposited, thereby forming a three layer Pt—Y1—Pt or Pt—YZ—Pt multilayered structure. The multilayer structure is then photolithographically patterned to define the individual pyroelectric detector sites or pixels. Portions of the multilayered structure are then selectively removed by, for example, ion milling or a reactive ion etch. The result is the formation of mesa-like structures each of which corresponds to one of the pyroelectric detectors or detector sites 10. Within each detector site suitable dimensions for the bismuth layered material are a thickness in the range of approximately 1000 Å to approximately 3000 Å, and linear dimensions of approximately 10 micrometers to approximately 50 micrometers. The pyroelectric detectors 10 are then blanket coated with a dielectric passivating layer which may also function as a layer of radiation-absorbing material. One suitable material is silicon dioxide. The silicon dioxide layer 22 is then patterned and etched to form vias, followed by the deposition and patterning of the via metalization for forming the electrical contacts 24 and 26. If desired, a suitable "black" coating can be applied to increase the absorption of the incident infrared radiation. Also, a suitable wavelength selective filter 28 can be either deposited on, or provided separately from, the array 1. By example, the filter 28 can be a thin film filter that passes infrared radiation in the wavelength band of approximately 10 micrometers to approximately 14 micrometers. Other wavelength-selective filtering techniques can be used, such as by providing a suitable grating.

Figure 3:
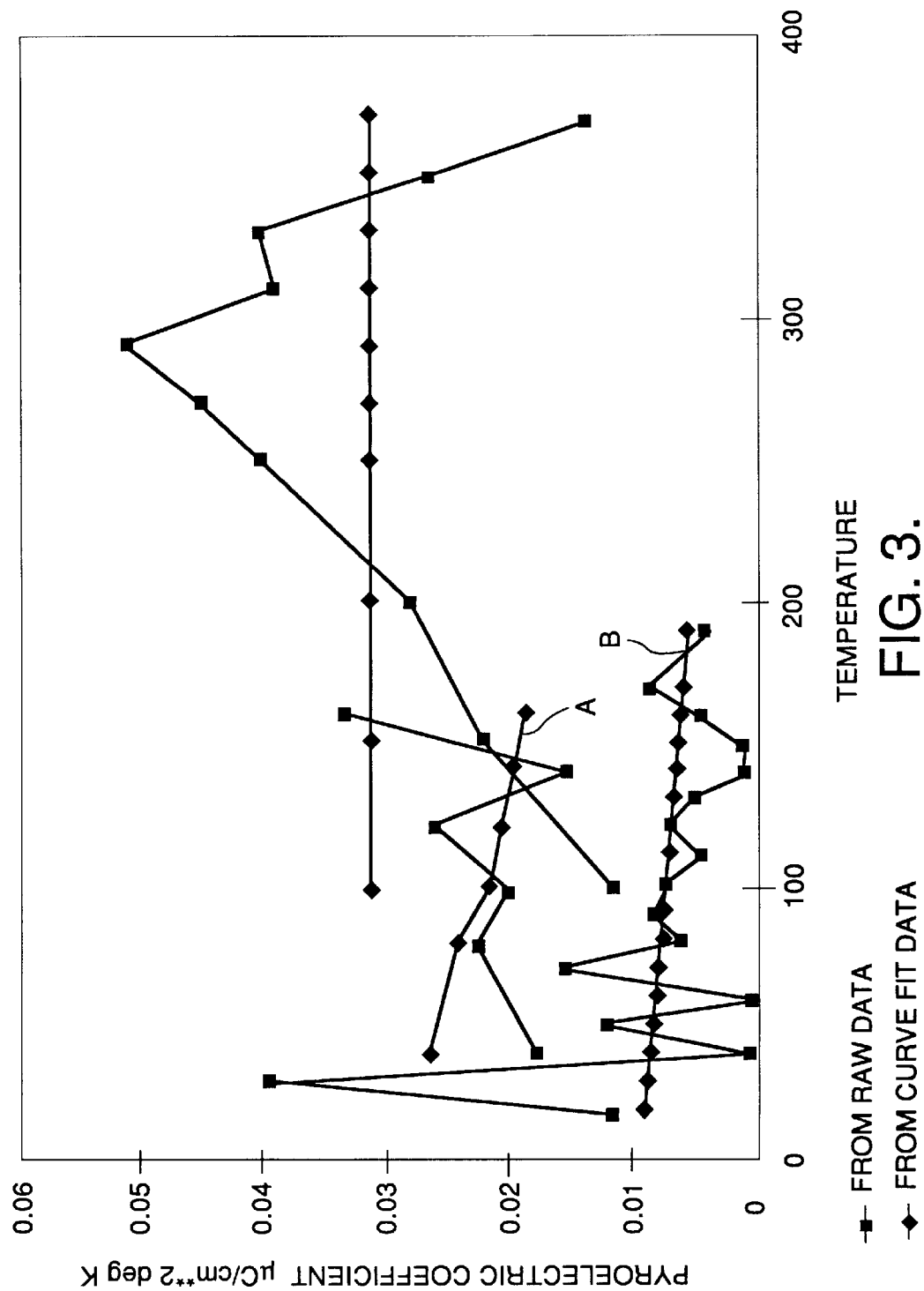
FIG. 3 is graph of pyroelectric coefficient vs. temperature for the bismuth layered compounds of interest.
Figure 4:
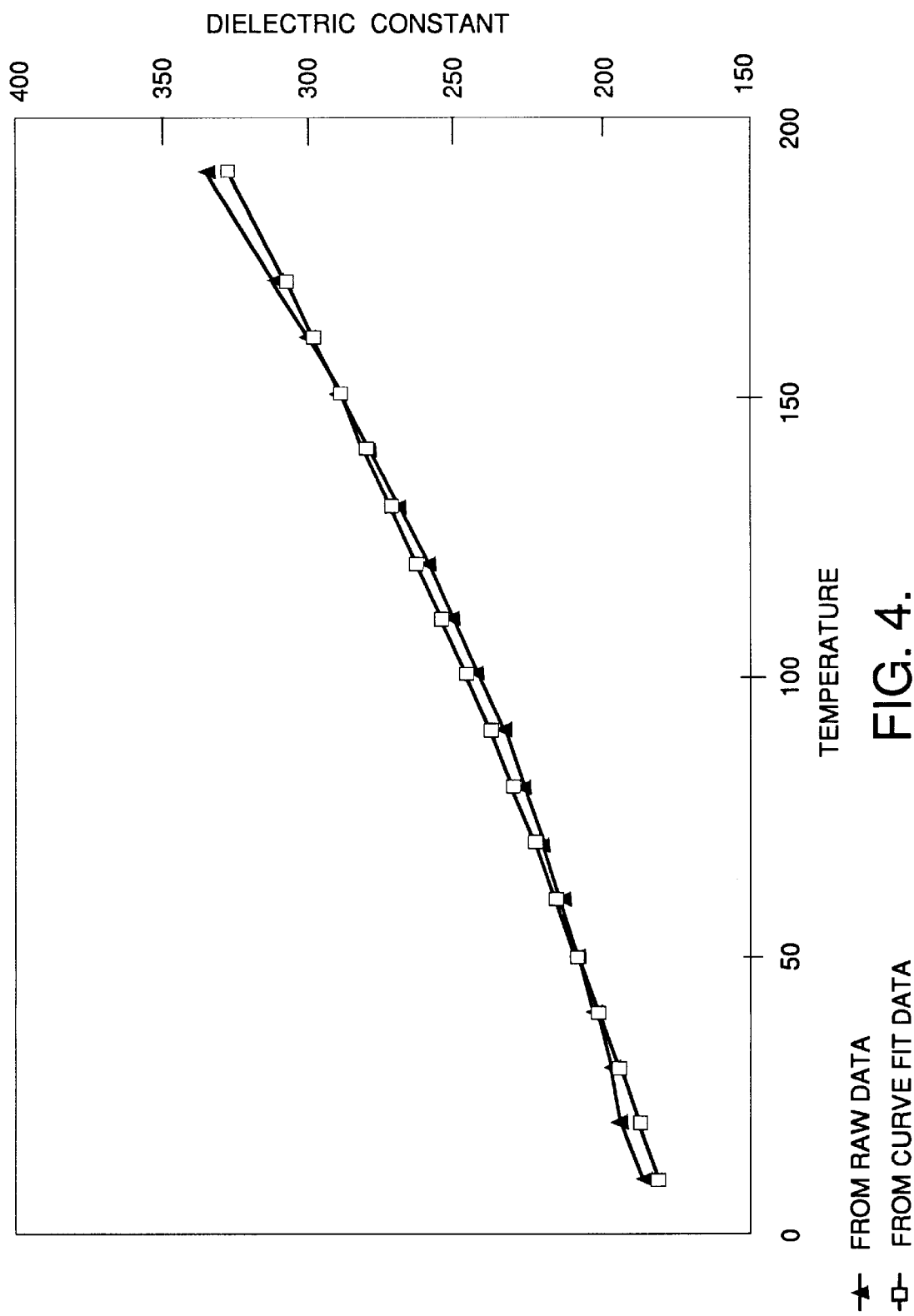
FIG. 4 is graph of dielectric constant vs. temperature for one of the bismuth layered compounds of interest.
Figure 5:
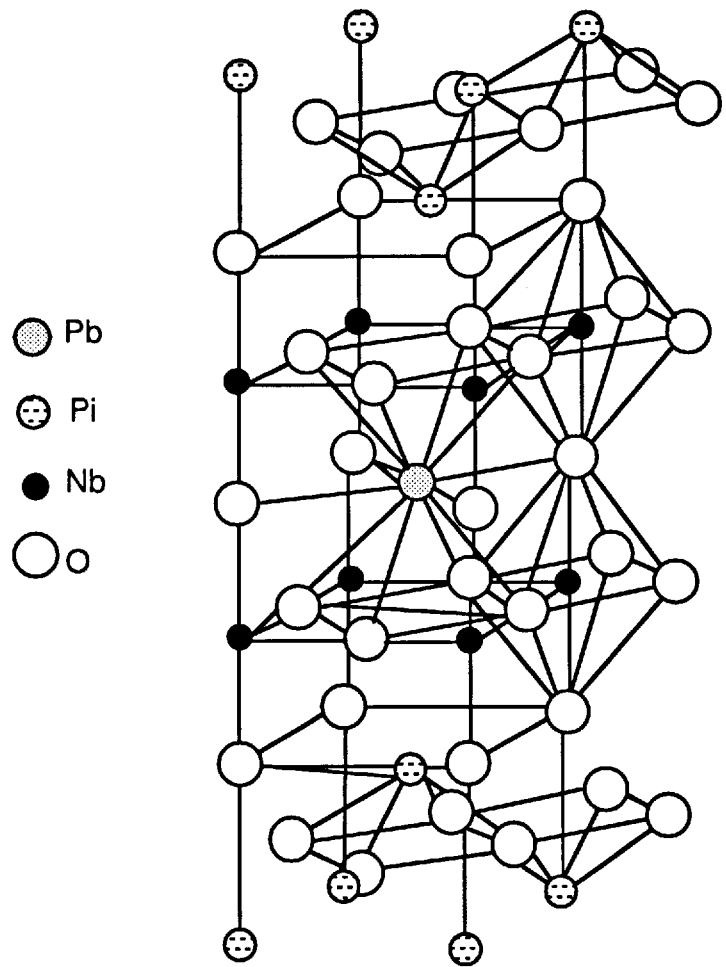
FIG. 5 depicts the atomic ordering of a conventional bismuth layered structural material.

FIGS. 2–4 are illustrative of the characteristics of the Y1 bismuth layered material that forms the layer 18. In FIG. 2 the polarization versus temperature is plotted for two different bismuth layer materials. The curves labeled A and B show two variations of the same basic material ($SrBi_2Ta_2O_9$). FIG. 3 plots the pyroelectric coefficient versus temperature for the same two bismuth layered materials. FIG. 3 also contrasts the raw data with curve fit data. As in FIG. 2, the traces A and B show the $SrBi_2Ta_2O_9$ material having the thicknesses of 2400 Å and 1800 Å. FIG. 4 plots the dielectric constant versus temperature for the 1800 Å thick layer of $SrBi_2Ta_2O_9$. It should be noted that the dielectric constant varies from approximately 175 to approximately 325 over a temperature range of approximately 15 degrees Celsius to approximately 190 degrees Celsius. The dielectric constant can be seen to be significantly less than that associated with many conventional pyroelectric materials, such as the above-mentioned PLZT.

Furthermore, the temperature ranges shown in FIGS. 2–4 illustrate that the use of bismuth layered materials, in accordance with this invention, enables the construction of infrared radiation detectors that are operable at room temperature and at temperatures that exceed room temperatures. That is, the necessity to cool many conventional infrared detectors to cryogenic operating temperatures is eliminated.

The use of the thin film bismuth layered materials with microbolometer structures to improve thermal isolation maintains detector responsivity, provides a more manufacturable (i.e., monolithic) structure, and reduces detector noise. In contrast, the conventional PLZT and PZT pyroelectric materials typically have thicknesses greater than 0.2 mm.

Although described in the context of presently preferred embodiments of this invention, it should be realized that the teaching of this invention is not to be construed to be limited to only these presently preferred embodiments. By example, the pyroelectric detectors of this invention are not limited for use only with infrared radiation, or only with infrared radiation having wavelengths within the band of approximately 10 micrometers to approximately 14 micrometers. In general, the spectral regions that may be utilized by various embodiments of this invention include, but are not limited to, the ultraviolet (below approximately 0.4 micrometers), the visible (approximately 0.4–0.8 micrometers), short wavelength IR (SWIR, approximately 0.8–3 micrometers), mid-wavelength IR (MWIR, approximately 3–8 micrometers), long wavelength IR (LWIR, approximately 8–12 micrometers), very long wavelength IR (VLWIR, approximately 12–20 micrometers), and the far IR (FIR, approximately 20–1000 micrometers). Also by example, other suitable substrate, dielectric, and radiation absorbing materials can be employed, other than the Si, $SiO_2$, and/or black coatings that were referred to above.

Thus, and although the invention has been particularly shown and described with respect to preferred embodiments thereof, it will be understood by those skilled in the art that changes in form and details may be made therein without departing from the scope and spirit of the invention.

What is claimed is:

1. A pyroelectric detector, comprising:
   a first electrode;
   a second electrode; and
   a layer comprised of a bismuth layered compound that is interposed between and electrically coupled to said first and second electrodes, wherein said layer is comprised of $SrBi_2Nb_{2-x}Ta_xO_9$, where 0<x<2.

2. A pyroelectric detector as set forth in claim 1 wherein said layer is comprised of an Aurivillius material.

3. An array of pyroelectric detectors, comprising:

a substrate; and a plurality of pyroelectric detector sites disposed over a surface of said substrate, each of said pyroelectric detector sites comprising:

a first electrode;

a second electrode; and a layer comprised of a bismuth layered compound that is interposed between and electrically coupled to said first and second electrodes, wherein said layer is comprised of $SrBi_2Nb_{2-x}Ta_xO_9$, where $0<x<2$.

4. An array of pyroelectric detectors as set forth in claim 3 wherein said layer is comprised of an Aurivillius material.

5. An array of pyroelectric detectors as set forth in claim 3 and further comprising a dielectric layer that is interposed between said surface and said plurality of pyroelectric detector sites.

6. An array of pyroelectric detectors as set forth in claim 3 wherein said array is employed for detecting electromagnetic radiation having wavelengths within a wavelength band of interest, and further comprising a layer of material that is substantially opaque to electromagnetic radiation having wavelengths within the wavelength band of interest, said substantially opaque layer overlying individual ones of said pyroelectric detector sites for converting incident electromagnetic energy into thermal energy.

7. An array of pyroelectric detectors as set forth in claim 3 wherein said array is employed for detecting electromagnetic radiation having wavelengths within a wavelength band of interest, and further comprising filter means that is interposed between said plurality of pyroelectric detectors and a source of said electromagnetic radiation, said filter means passing electromagnetic radiation having wavelengths within the wavelength band of interest.

8. An array of pyroelectric detectors as set forth in claim 3 wherein said array is employed for detecting electromagnetic radiation having wavelengths within a wavelength band that includes the infrared band.

9. An array of pyroelectric detectors as set forth in claim 8 wherein said wavelength band includes approximately 10 micrometers to approximately 14 micrometers.

10. An array of pyroelectric detectors as set forth in claim 3 wherein said layer comprised of a bismuth layered compound has a thickness within a range of approximately 1000 Å to approximately 3000 Å.

11. An imaging array for sensing infrared (IR) radiation, said imaging array being comprised of a substrate and further comprising a plurality of pyroelectric IR radiation detector sites disposed over a surface of said substrate, each of said sites including a layer comprised of $SrBi_2Nb_{2-x}Ta_xO_9$, where $0<x<2$, a first electrode electrically coupled to said layer and interposed between said layer and said substrate, and a second electrode electrically coupled to said layer; said array further comprising an IR radiation absorber for converting incident IR radiation into heat that is detectable by said sites.

12. An imaging array as set forth in claim 11 and further comprising filter means that is interposed between said plurality of sites and a source of IR radiation, said filter means passing IR radiation having wavelengths within a wavelength band of interest.

13. An imaging array as set forth in claim 11 wherein said layer has a thickness within a range of approximately 1000 Å to approximately 3000 Å.

\* \* \* \* \*